US008032388B1

(12) United States Patent
Luh et al.

(10) Patent No.: US 8,032,388 B1
(45) Date of Patent: Oct. 4, 2011

(54) DYNAMIC SELECTION OF SUPPORTED AUDIO SAMPLING RATES FOR PLAYBACK

(75) Inventors: Walter Luh, Sunnyvale, CA (US); David Knight, San Jose, CA (US)

(73) Assignee: Adobe Systems Incorporated, San Jose, CA (US)

( * ) Notice: Subject to any disclaimer, the term of this patent is extended or adjusted under 35 U.S.C. 154(b) by 986 days.

(21) Appl. No.: 11/923,462

(22) Filed: Oct. 24, 2007

Related U.S. Application Data

(60) Provisional application No. 60/976,297, filed on Sep. 28, 2007.

(51) Int. Cl.
*G10L 21/04* (2006.01)
*G10L 19/00* (2006.01)
*H03M 7/00* (2006.01)

(52) U.S. Cl. ................ 704/503; 704/500; 704/E19.048; 341/61

(58) Field of Classification Search .................. 704/500, 704/503, E19.048; 341/61
See application file for complete search history.

(56) References Cited

U.S. PATENT DOCUMENTS 5,835,495 A * 11/1998 Ferriere ........................ 370/465
5,907,295 A * 5/1999 Lin ................................. 341/61
5,963,153 A 10/1999 Rosefield et al.
5,986,589 A 11/1999 Rosefield et al.
6,000,834 A 12/1999 Duan
6,057,789 A * 5/2000 Lin ................................. 341/61
6,215,737 B1 * 4/2001 Thagard et al. ................... 369/4
6,751,177 B1 * 6/2004 Abe et al. ................... 369/59.21
7,528,745 B2 * 5/2009 Wang et al. ...................... 341/61
7,702,039 B2 * 4/2010 Gieske et al. ................. 375/324
7,792,806 B2 * 9/2010 Dunbar et al. ................ 707/705
* cited by examiner

*Primary Examiner* — Talivaldis Ivars Smits
*Assistant Examiner* — Jesse Pullias
(74) *Attorney, Agent, or Firm* — Fish & Richardson P.C.

(57) ABSTRACT

A source sampling rate is associated with first or second groups of sampling rates. A playback rate is determined by: (a) selecting the source sampling rate if the source sampling rate is supported by a playback environment; (b) otherwise if there is a highest first rate from the first or second groups of playback sampling rates which is supported by the playback environment and is lower than the source sampling rate, selecting the first rate; (c) otherwise if there is a slowest second rate from the group that the source sampling rate is associated with that is supported by the playback environment and is higher than the source sampling rate, selecting the second rate; (d) otherwise selecting the slowest sampling rate supported by the playback environment from the group that the source sampling rate is not associated with as the playback rate.

21 Claims, 6 Drawing Sheets

DYNAMIC SELECTION OF SUPPORTED AUDIO SAMPLING RATES FOR PLAYBACK

CROSS-REFERENCE TO RELATED APPLICATIONS

This application claims priority to pending U.S. Provisional Application Ser. No. 60/976,297, filed Sep. 28, 2007, the entire contents of which are hereby incorporated by reference.

BACKGROUND

An analog audio signal can be converted to a discrete digital representation by a technique known as sampling. The sampling rate is the number of samples per second (or other unit) taken from the analog signal in order to create the digital representation or "digital audio". Samples are typically stored as a series of numbers representing the signal amplitudes at the points in time at which the samples were taken. For example, FIG. 1A illustrates an analog signal 102 which is sampled eight times per second. Three sample points are shown at 104*a-c*. FIG. 1B illustrates the same analog signal 102 but with an increased sampling rate of sixteen times per second. Three sample points are also shown at 108*a-c*. In general, an audio signal sampled at a faster sampling rate will allow for better reconstruction of a signal containing a higher maximum frequency component when the digital audio is converted back into an analog signal. Higher sampling rates, however, require faster digital processing speeds, which put demands on computer processing resources and memory.

In constrained devices such as such as mobile phones and personal data assistants, for example, playback of digital audio is typically only supported for particular sampling rate(s). This can be due to the limited processing capabilities of the devices, lack of audio hardware support, or lack of software support. Some approaches to this problem involve republishing the digital audio in supported sampling rates or server-side conversion of digital audio to supported sampling rates. But some content may not be able to be republished because the original project files are not available. Furthermore, server-side conversion of digital audio can be impractical for a large volume of traffic.

Software applications for some constrained devices can accommodate unsupported sampling rates by re-sampling uncompressed digital audio at a sampling rate that the device supports. By way of illustration and with reference to FIG. 2, a source 200 containing compressed digital audio is provided to a playback environment 204 for device 202. The digital audio in source 200 is decompressed by codec 206 into decompressed audio 208. If the playback environment 204 supports the sampling rate of the decompressed audio 208, the decompressed digital audio 208 can be converted back into an analog signal and outputted to one or more speakers 220 or provided as output signals. If the decompressed audio 208 was encoded at an unsupported sampling rate, the decompressed audio can be converted to the supported sampling rate by an application sample rate converter 210 that re-samples the decompressed audio 208 at the supported sampling rate. However, re-sampling digital audio can introduce noise, particularly when increasing the sampling rate, and can reduce the maximum frequency that can be completely reconstructed into the analog signal when converting a source signal to a slower sampling rate output signal.

SUMMARY

In general, one or more aspects of the subject matter described in this specification can be embodied in one or more methods that include identifying a source sampling rate for content, where the source sampling rate is associated with a first group of playback sampling rates or a distinct second group of playback sampling rates. A playback rate for the source sampling rate is determined as follows: (a) selecting the source sampling rate as a playback rate if the source sampling rate is supported by a playback environment; (b) otherwise if there is a highest first rate from the first or second groups of playback sampling rates which is supported by the playback environment and is lower than the source sampling rate, selecting the first rate as the playback rate; (c) otherwise if there is a slowest second rate from the group that the source sampling rate is associated with that is supported by the playback environment and is higher than the source sampling rate, selecting the second rate as the playback rate; (d) otherwise selecting the slowest sampling rate supported by the playback environment from the group that the source sampling rate is not associated with as the playback rate. Other embodiments of this aspect include corresponding systems, apparatus, and computer program products.

These and other embodiments can optionally include one or more of the following features. The playback environment is a software program or a device. The first group of playback rates comprises 5.5 kHz, 11 kHz, 22 kHz, and 44 kHz; and the second group of playback rates comprises 8 kHz, 16 kHz, and 32 kHz. Rates in a group of playback sampling rates are multiples of a base sampling rate. The content is one or more of: audio, video, and Adobe Flash. A sampling rate is supported by the playback environment if the playback environment can produce sounds at the sampling rate. The steps (a), (b), (c) and (d) are performed in that order.

Particular embodiments of the subject matter described in this specification can be implemented to realize one or more of the following advantages. Given supported sampling rates of a playback environment and a sound source which is of a different sampling rate, noise introduced through sampling rate conversion can be minimized, and reduction of the maximum frequency that can be perfectly reconstructed in the analog signal can be minimized. Down-sampling is favored over up-sampling in order to avoid introducing noise artifacts that can occur in up-sampling.

The details of one or more embodiments of the invention are set forth in the accompanying drawings and the description below. Other features, aspects, and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

Figure 1A:
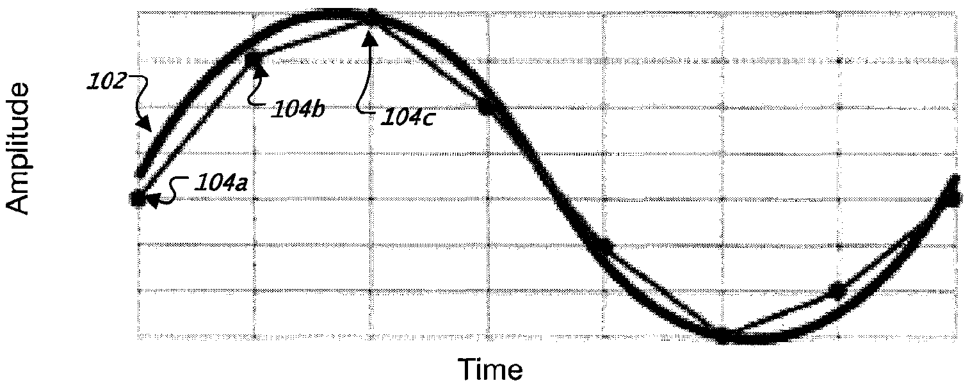
FIG. 1A (Prior Art)
FIGS. 1A-B illustrate different sampling rates.
Figure 1B:
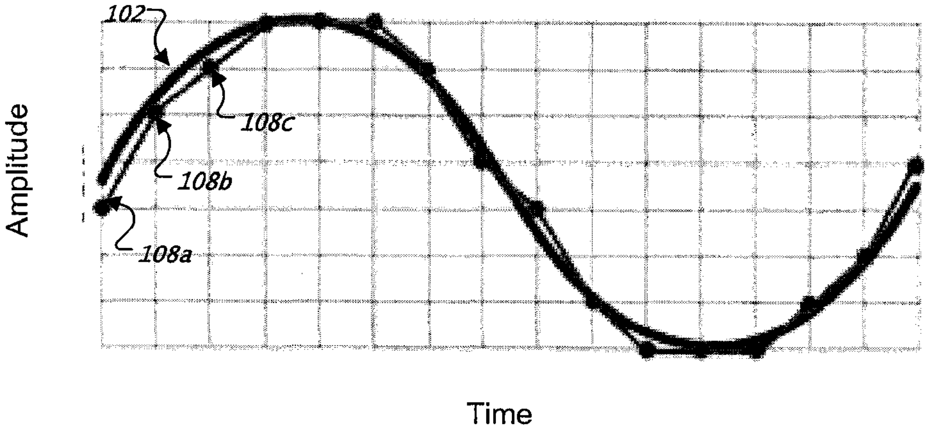
FIG. 1B (Prior Art)
Figure 2:
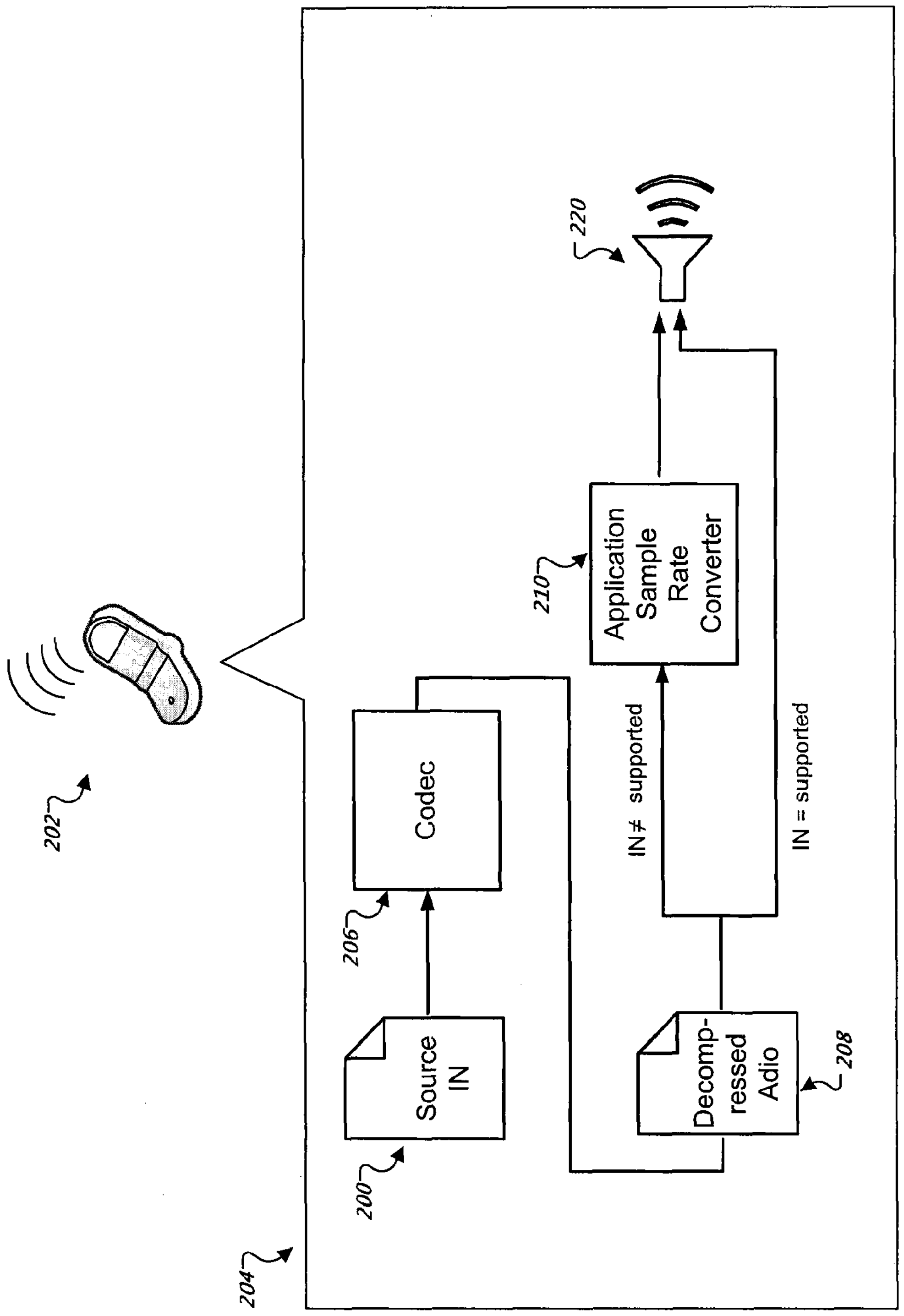
FIG. 2 (Prior Art)
FIG. 2 is an example of a prior art playback environment.
Figure 3:
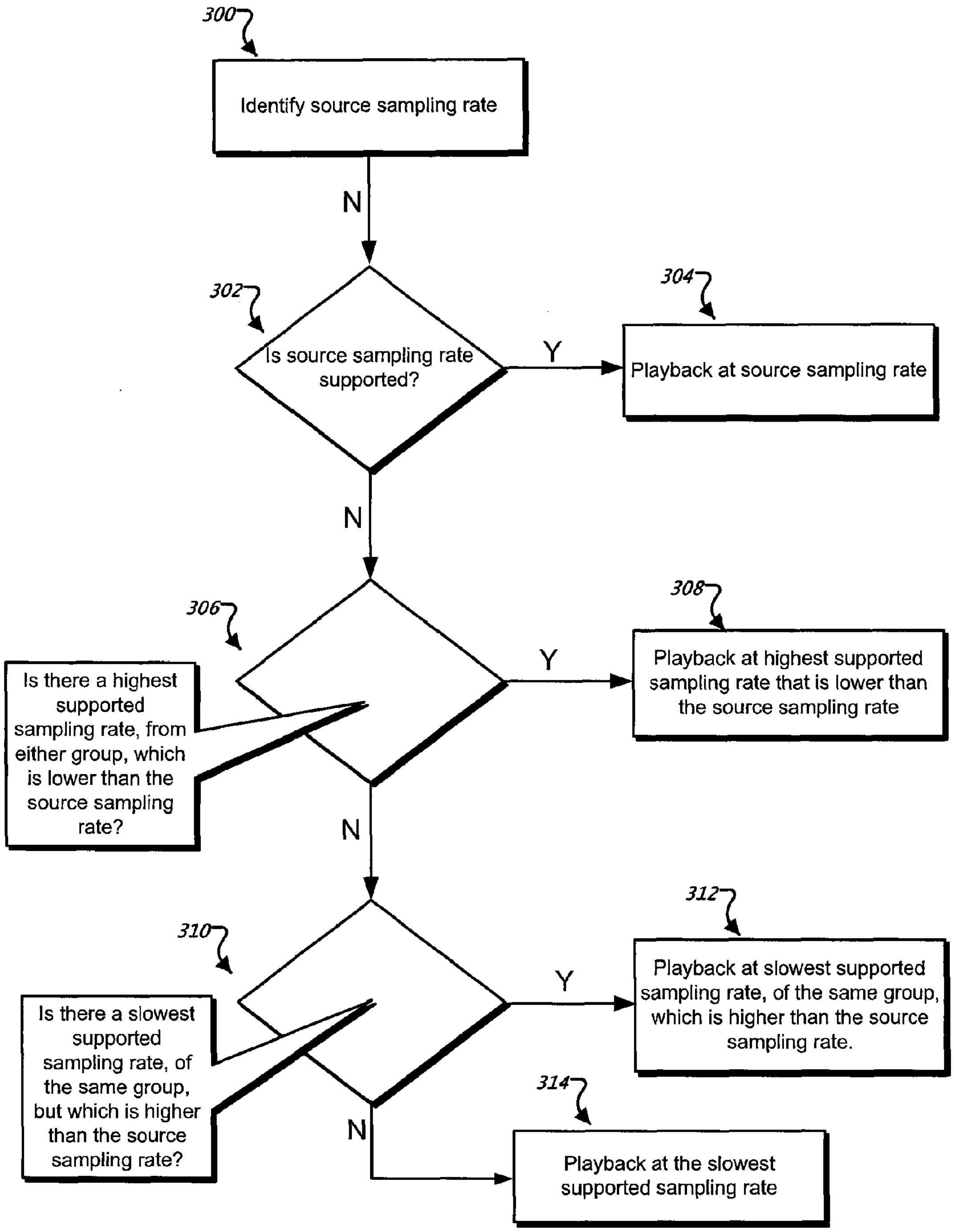
FIG. 3 is an example of a technique for improving playback of digital audio.

FIG. 3 is an example of a technique for improving playback of digital audio, as might be implemented in a playback environment for a device, for example. Initially, a sampling rate for source digital audio to be played back is identified (300). The digital audio may be represented in a file, a network communication stream, a data structure in memory, or combinations of these. The digital audio can be represented in formats including uncompressed audio formats such as Waveform Audio (WAV) and Audio Interchange File Format (ANT); formats with lossless compression such as Free Lossless Audio Codec (FLAC), Monkey's Audio, WavPack, Shorten, Trie Audio (TTA), Apple Lossless and lossless Windows Media Audio (WMA); and formats with lossy compression such as MP3, Vorbis, lossy Windows Media Audio (WMA) and AAC; and other formats such as the Shockwave Flash (SWF) file format. Other formats are possible.

The digital audio may also be incorporated into or embedded into other content such as images, video, vector graphics, slide show presentations, and combinations of these, for example. A given content can have one or more pieces of digital audio content, where each can be encoded at the same sampling rate or at differing sampling rates. By way of illustration, digital audio content can be included in video content which conforms to a video format such as National Television Systems Committee (NTSC), Phase Alternating Line (PAL), and others. For example, a video of a dog barking would typically include a digital audio sound track for the barking sound of the dog. The audio track is processed by the playback environment to reproduce the sounds at an appropriate fidelity and, where applicable, in sync with associated video.

If the source digital audio's identified sampling rate is supported by a playback environment (302), then the digital audio can be played at that sampling rate without conversion (304). This is ideal because no sampling rate conversion is needed. For example, a device's playback environment may support playback at 22 kHz and the digital audio was encoded at 22 kHz, approximately 22 kHz, or within some acceptable range of 22 kHz.

Digital audio is commonly sampled at a frequency that is an integral multiple of a base frequency. In various implementations, a sampling rate group is a set of sampling rates that are integral multiples of a base sampling rate. A sampling rate is associated with a sampling rate group if the sample rate is a integral multiple of the group's base sampling rate. In various implementations, a first group of sampling rates is a multiple of the sampling rate of approximately 5.5 KHz. Sampling rates of this group are approximately 5.5 kHz, 11 kHz, 22 kHz, 44 kHz, and so on. For instance, compact discs (CDs) are sampled at approximately 44 kHz. In various implementations, a second group of sampling rates is a multiple of 8 kHz, with sampling rates of approximately 8 kHz, 16 kHz, 32 kHz, 48 kHz, and so on. Digital video discs (DVDs) are typically sampled at 48 kHz. In some implementations, a playback environment will support one or more of the sampling rates from one or both of the groups.

If the source digital audio's sampling rate is not supported by the playback environment, it is determined if there is a highest supported sampling rate, from either group, but which is lower than the source sampling rate (step 306). If so, then this sampling rate will be used for playback (step 308). By way of illustration, suppose the source digital audio has a sampling rate of 32 kHz and a playback device supports 5.5 kHz, 8 kHz, 11 kHz and 44 kHz. In this case, the selected playback sampling rate would be 11 kHz.

Otherwise, the process will determine if there is a slowest supported sampling rate, of the group that the source sampling rate is associated with, but which is higher than the source sampling rate (310). If so, then this rate will be used for playback (312). Otherwise, the slowest rate supported by the playback environment from the sampling rate group that the source sampling rate is not associated with is selected as the playback sampling rate (314).

For example, suppose digital audio with a source sampling rate of 22 kHz is to be played on a device with a playback environment supporting 32 kHz and 44 kHz. Note that the source sampling rate of 22 kHz is associated with the 5.5 kHz group since 22 is a integral multiple of 5.5. Following step 302, the source sampling rate is not supported, and following step 306, there is not a highest supported sampling rate, from either group, that is lower than the source sampling rate. The process then moves to step 310. Although the next faster supported rate is 32 KHz, this rate is a member of the 8 kHz group and not a member of the 5.5 KHz group. Therefore, the content will be played back at 44 kHz.

Figure 4:
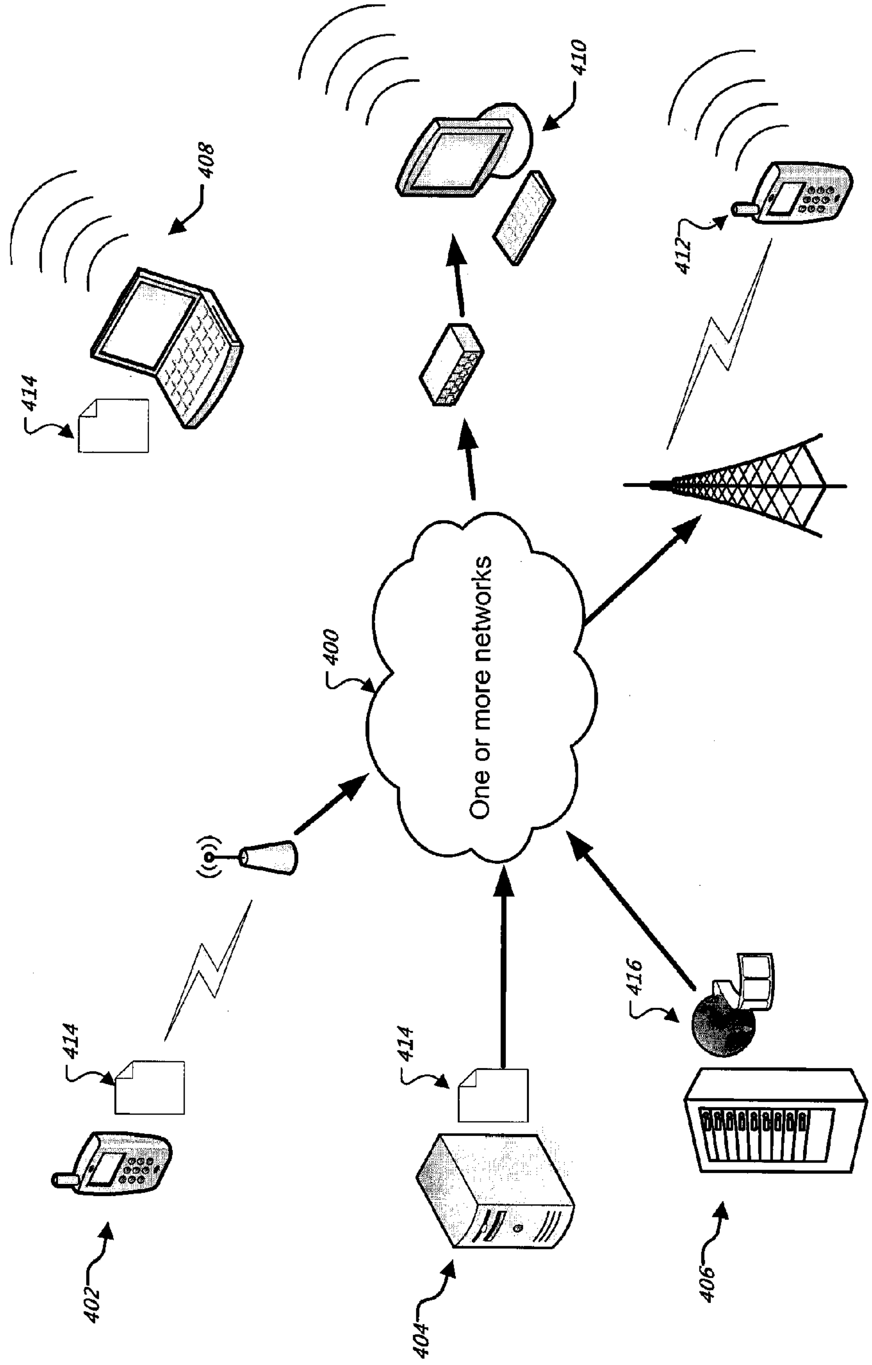
FIG. 4 illustrates example digital audio distribution paths.

FIG. 4 illustrates examples of digital audio distribution paths. Content such as digital audio or content containing digital audio is distributed over one or more communication networks 400 from its source to one or more playback devices. Sources may include, without limitation, handheld devices 402 such as mobile phones, media players, electronic games, and personal digital assistants; computing devices such as personal computers 404, including desktop and laptop computers; and servers or server farms 406. Other sources are possible. Content may be provided as files 414 or streams 416 through different network protocols such as client-server and peer-to-peer protocols, for example. Content may be transmitted to the network 400 wirelessly, as shown from handheld device 402, or by wire, for example by Cable Internet or Digital Subscriber Line (DSL) as shown from computer 404 and server 406. Likewise, the content can be received by various types of devices, such as by mobile computer 408, desktop computer 410 or mobile phone 412, and similar devices, either by wireless or wired connection to the network 400. As also illustrated in FIG. 4, digital audio may also be stored locally. Computer 408 is shown with content stored locally, e.g. on a disk, hard drive, or other local device.

Figure 5:
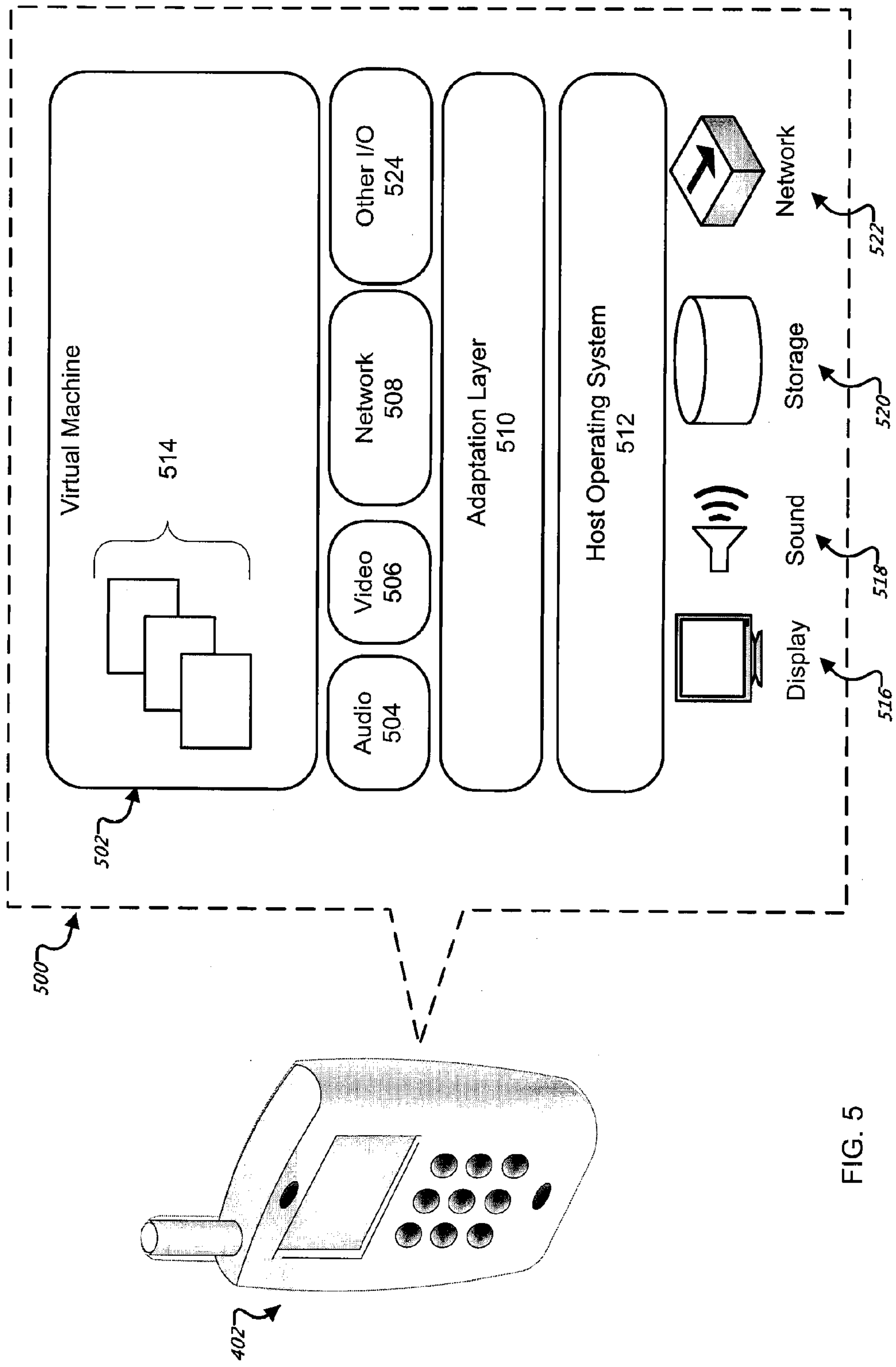
FIG. 5 illustrates an example playback environment for digital audio.

FIG. 5 illustrates an example playback environment 500 for processing digital audio. Although several components are illustrated, there may be fewer or more components in the environment 500. Components can be implemented in hardware, firmware, software or combinations thereof. Moreover, the components can be distributed on one or more computing devices connected by one or more networks or other suitable communication means.

The playback environment 500 includes an audio component 504 which is responsible for identifying the sampling rate of a digital audio source and determining the appropriate playback sampling rate to use for the source according to the technique described in FIG. 3, for example. The audio component 504 can include a sampling rate converter and one or more codecs, for example. The playback environment 504 can produce analog audio based on decoded digital audio to be output on one or more speakers or as output signals 518.

The playback environment 500 includes an optional video component 506 which is responsible for decoding video sources and presenting a sequence of images representing the decoded video sources on a peripheral device such as display 516. The video component 506 can provide digital audio that is part of a video content to the audio component 504 for decoding. Alternatively, a virtual machine component 502 can coordinate the simultaneous decoding of audio and video by directing such sources to the audio component 504 and the video component 506, respectively, and keeping the audio and visual playback in sync.

In various implementations, the virtual machine 514 creates a virtualized environment for executing software 514

(e.g., ActionScript or JavaScript code) on an abstract machine, rather than a specific microprocessor architecture, for example. Two common examples of virtual machines are the ActionScript virtual machine which is part of the Adobe Flash Player available from Adobe Systems Incorporated and the Java Virtual Machine available from Sun Microsystems, Inc. The virtual machine 504 can also utilize a network component 508 for sending and receiving information (e.g., content files or streams) over the network, and an I/O component 524 for accessing storage and device capabilities on the underlying hardware.

In various implementations, the sound 504, video 506, network 508 and I/O 524 components access underlying hardware capabilities through the device 402's operating system 512. The operating system 512 provides programmatic access to system functions for accessing hardware such as video outputs 516, sound outputs 518, storage 520 such as random access memory, Flash memory, or disk drives, and network interfaces 522 (e.g., Ethernet).

In various implementations, the components 504, 506, 508 and 524 access the host operating system functionality 512 by means of an adaptation layer 510 which hides the differences in underlying operating systems 512 from the components. In various implementations, the adaptation layer 510 is an application programming interface (API) that provides the same interface to the components regardless of the underlying operating system 512. The API is ported to each operating system 512 on which the playback environment 500 will run.

Figure 6:
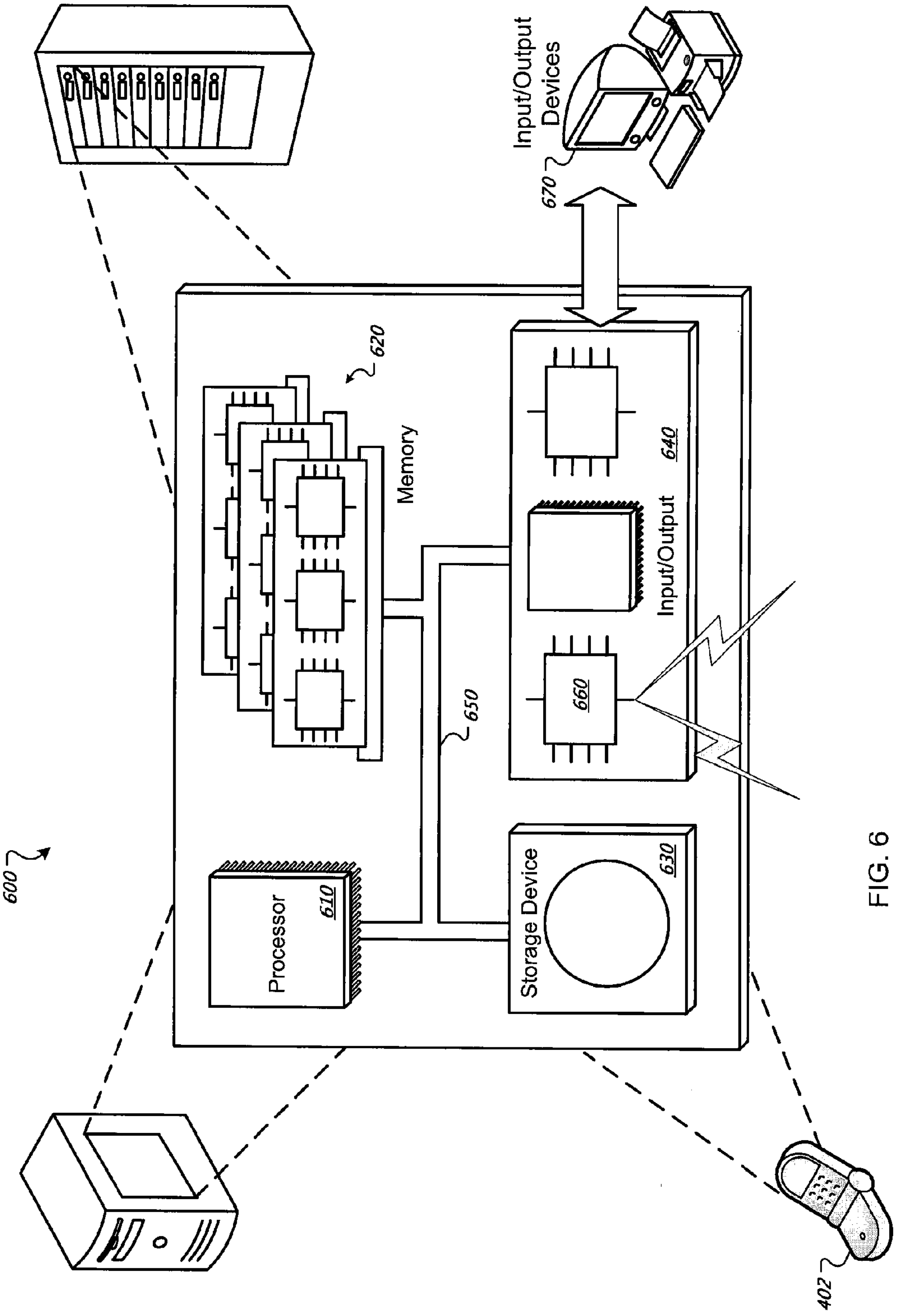
FIG. 6 illustrates an example generic computer system for implementing a playback environment.

FIG. 6 illustrates an example generic computer system for implementing a playback environment. A system 600 can include a processor 610, a memory 620, a storage device 630, input/output processor components 640 including a wireless network transceiver 660, and input/output devices 670. Each of the components 610, 620, 630, and 640 are interconnected using a system bus 650. The processor 610 is capable of processing instructions for execution within the system 600. Such executed instructions can implement one or more components of playback environment 500, for example. In one implementation, the processor 610 is a single-threaded or multi-threaded processor with one or more processor cores. The processor 610 is capable of processing instructions stored in the memory 620 or on the storage device 630 to display graphical information for a user interface on a display device 670 or implement a playback environment.

The memory 620 is a computer readable medium such as volatile or non volatile random access memory that stores information within the system 600. The memory 620 could store data structures representing audio content and instructions for implementing one or more components of a playback environment, for example. The storage device 630 is capable of providing persistent storage for the system 600. The storage device 630 may be a floppy disk device, a hard disk device, an optical disk device, or a tape device, or other suitable persistent storage means. The input/output devices 670 provides input/output operations for the system 600. In one implementation, the input/output devices 670 includes a keyboard and/or pointing device (e.g., a mouse). In another implementation, the input/output devices 670 includes a display unit for displaying graphical user interfaces.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a computer-readable medium for execution by, or to control the operation of, data processing apparatus. The computer-readable medium can be a machine-readable storage device, a machine-readable storage substrate, a memory device, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described is this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. For example, the actions recited in the claims can be performed in a different order and still achieve desirable results.

What is claimed is:

1. A method for determining a playback sampling rate for audio playback, comprising:

identifying, using a computer system a source sampling rate for content, where the source sampling rate is associated with a first group of playback sampling rates or a distinct second group of playback sampling rates; and determining, using the computer system, a playback rate for the source sampling rate as follows:

(a) selecting the source sampling rate as a playback rate if the source sampling rate is supported by a playback environment;

(b) otherwise if there is a highest first rate from the first or second groups of playback sampling rates which is supported by the playback environment and is lower than the source sampling rate, selecting the first rate as the playback rate;

(c) otherwise if there is a slowest second rate from the group that the source sampling rate is associated with that is supported by the playback environment and is higher than the source sampling rate, selecting the second rate as the playback rate; and (d) otherwise selecting the slowest rate supported by the playback environment from the group that the source sampling rate is not associated with as the playback rate.

2. The method of claim 1 where the playback environment is a software program or a device.

3. The method of claim 1 where:

the first group of playback rates comprises 5.5 kHz, 11 kHz, 22 kHz, and 44 kHz; and where the second group of playback rates comprises 8 kHz, 16 kHz, and 32 kHz.

4. The method of claim 1 where rates in a group of playback sampling rates are multiples of a base sampling rate.

5. The method of claim 1 where the content is one or more of: audio, video, and Adobe Flash.

6. The method of claim 1 where a sampling rate is supported by the playback environment if the playback environment can produce sounds at the sampling rate.

7. The method of claim 1 where the steps (a), (b), (c) and (d) are performed in that order.

8. A computer program product, encoded on a non-transitory computer-readable medium, operable to cause data processing apparatus to perform operations comprising:

identifying a source sampling rate for content, where the source sampling rate is associated with a first group of playback sampling rates or a distinct second group of playback sampling rates; and determining a playback rate for the source sampling rate as follows:

(a) selecting the source sampling rate as a playback rate if the source sampling rate is supported by a playback environment;

(b) otherwise if there is a highest first rate from the first or second groups of playback sampling rates which is supported by the playback environment and is lower than the source sampling rate, selecting the first rate as the playback rate;

(c) otherwise if there is a slowest second rate from the group that the source sampling rate is associated with that is supported by the playback environment and is higher than the source sampling rate, selecting the second rate as the playback rate; and (d) otherwise selecting the slowest rate supported by the playback environment from the group that the source sampling rate is not associated with as the playback rate.

9. The program product of claim 8 where the playback environment is a software program or a device.

10. The program product of claim 8 where:

the first group of playback rates comprises 5.5 kHz, 11 kHz, 22 kHz, and 44 kHz; and where the second group of playback rates comprises 8 kHz, 16 kHz, and 32 kHz.

11. The program product of claim 8 where rates in a group of playback sampling rates are multiples of a base sampling rate.

12. The program product of claim 8 where the content is one or more of: audio, video, and Adobe Flash.

13. The program product of claim 8 where a sampling rate is supported by the playback environment if the playback environment can produce sounds at the sampling rate.

14. The program product of claim 8 where the steps (a), (b), (c) and (d) are performed in that order.

15. A system for determining a playback sampling rate for audio playback, comprising:

a processor; and a computer program product, encoded on a non-transitory computer-readable medium, the computer program product comprising instructions that when executed cause the processor to perform operations comprising:

identifying a source sampling rate for content, where the source sampling rate is associated with a first group of playback sampling rates or a distinct second group of playback sampling rates; and determining a playback rate for the source sampling rate as follows:

(a) selecting the source sampling rate as a playback rate if the source sampling rate is supported by a playback environment;

(b) otherwise if there is a highest first rate from the first or second groups of playback sampling rates which is supported by the playback environment and is lower than the source sampling rate, selecting the first rate as the playback rate;

(c) otherwise if there is a slowest second rate from the group that the source sampling rate is associated with that is supported by the playback environment and is higher than the source sampling rate, selecting the second rate as the playback rate; and (d) otherwise selecting the slowest rate supported by the playback environment from the group that the source sampling rate is not associated with as the playback rate.

16. The system of claim 15 where the playback environment is a software program or a device.

17. The system of claim 15 where:

the first group of playback rates comprises 5.5 kHz, 11 kHz, 22 kHz, and 44 kHz; and where the second group of playback rates comprises 8 kHz, 16 kHz, and 32 kHz.

18. The system of claim 15 where rates in a group of playback sampling rates are multiples of a base sampling rate.

19. The system of claim 15 where the content is one or more of: audio, video, and Adobe Flash.

20. The system of claim 15 where a sampling rate is supported by the playback environment if the playback environment can produce sounds at the sampling rate.

21. The system of claim 15 where the steps (a), (b), (c) and (d) are performed in that order.

* * * * *

UNITED STATES PATENT AND TRADEMARK OFFICE

CERTIFICATE OF CORRECTION

PATENT NO. : 8,032,388 B1
APPLICATION NO. : 11/923462
DATED : October 4, 2011
INVENTOR(S) : Luh et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 988 days.

Signed and Sealed this
Fourteenth Day of February, 2012

David J. Kappos
*Director of the United States Patent and Trademark Office*